(12) United States Patent
Jung et al.

(10) Patent No.: US 9,543,968 B2
(45) Date of Patent: Jan. 10, 2017

(54) OUTPUT CONTROL CIRCUIT FOR SEMICONDUCTOR APPARATUS AND OUTPUT DRIVING CIRCUIT INCLUDING THE SAME

(71) Applicant: SK hynix Inc., Icheon-si, Gyeonggi-do (KR)

(72) Inventors: Jong Ho Jung, Icheon-si (KR); Da In Im, Icheon-si (KR)

(73) Assignee: SK HYNIX INC., Icheon-si (KR)

( * ) Notice: Subject to any disclaimer, the term of this patent is extended or adjusted under 35 U.S.C. 154(b) by 0 days.

(21) Appl. No.: 15/059,453

(22) Filed: Mar. 3, 2016

(65) Prior Publication Data

US 2016/0191065 A1 Jun. 30, 2016

Related U.S. Application Data

(62) Division of application No. 14/306,423, filed on Jun. 17, 2014, now Pat. No. 9,306,582.

(30) Foreign Application Priority Data

Mar. 27, 2014 (KR) ........................ 10-2014-0036229

(51) Int. Cl.
| | |
|---|---|
| *G11C 7/00* | (2006.01) |
| *H03L 7/081* | (2006.01) |
| *H03K 5/14* | (2014.01) |
| *H03L 7/08* | (2006.01) |
| *H03L 7/00* | (2006.01) |
| *H03K 17/22* | (2006.01) |
| *H03K 5/00* | (2006.01) |

(52) U.S. Cl.
CPC .............. *H03L 7/0812* (2013.01); *H03K 5/14* (2013.01); *H03K 17/22* (2013.01); *H03L 7/00* (2013.01); *H03L 7/08* (2013.01); *H03K 2005/00097* (2013.01)

(58) Field of Classification Search
CPC ........................................................ G11C 7/22
See application file for complete search history.

(56) References Cited

U.S. PATENT DOCUMENTS

2010/0315139 A1* 12/2010 Kim ..................... G11C 7/1066
327/158

* cited by examiner

*Primary Examiner* — Daniel Puentes
(74) *Attorney, Agent, or Firm* — William Park & Associates Ltd.

(57) ABSTRACT

An output control circuit may include a period setting signal generation unit configured to output a setup signal enabled during a designated period, in response to a delayed locked loop (DLL) locking signal and an output enable reset signal. The output control circuit may also include a clock division unit configured to divide an internal clock at a preset division ratio in response to the setup signal, and output a divided clock. In addition, the output control circuit may include a shift unit configured to shift the setup signal by a preset first time in response to the divided clock, and output a first delayed setup signal. Further, the output control circuit may include an output unit configured to receive and process the first delayed setup signal in response to the divided clock, and output the output enable reset signal.

10 Claims, 4 Drawing Sheets

OUTPUT CONTROL CIRCUIT FOR SEMICONDUCTOR APPARATUS AND OUTPUT DRIVING CIRCUIT INCLUDING THE SAME

CROSS-REFERENCES TO RELATED APPLICATION

The present application is a Division of U.S. application Ser. No. 14/306,423, filed on Jun. 17, 2014, and the present application claims priority under 35 U.S.C. §119(a) to Korean application number 10-2014-0036229, filed on Mar. 27, 2014, in the Korean Intellectual Property Office, which is incorporated herein by reference in its entirety.

BACKGROUND

1. Technical Field

Various embodiments relate to a semiconductor apparatus, and more particularly, to an output control circuit and an output driving circuit including the same.

2. Related Art

A semiconductor memory apparatus includes a circuit for synchronizing the operation timings of an external clock signal and an internal clock signal. Examples of the circuit may include a delay locked loop (DLL) circuit, an output control circuit and the like.

The DLL circuit generates an internal clock signal by delaying an external clock signal by a desired time. In general, a semiconductor apparatus inevitably has a delay time while a clock signal is transmitted. The DLL circuit reflects the delay time of the semiconductor apparatus into an external clock signal and performs a locking operation to generate an internal signal.

SUMMARY

In an embodiment, an output control circuit may include a period setting signal generation unit configured to output a setup signal enabled during a designated period, in response to a delayed locked loop (DLL) locking signal and an output enable reset signal. The output control circuit may also include a clock division unit configured to divide an internal clock at a preset division ratio in response to the setup signal, and output a divided clock. Further, the output control circuit may also include a shift unit configured to shift the setup signal by a preset first time in response to the divided clock, and output a first delayed setup signal. The output control circuit may also include an output unit configured to receive and process the first delayed setup signal in response to the divided clock, and output the output enable reset signal.

In an embodiment, an output driving circuit may include an output enable reset signal generation circuit configured to generate a first delayed setup signal by shifting a setup signal in synchronization with a divided clock obtained by dividing an internal clock in response to a delay locked loop (DLL) locking signal. The output enable reset signal generation circuit may also generate an output enable reset signal by processing the first delayed setup signal in response to the divided clock. The output driving circuit may also include a delay circuit configured to delay the output enable reset signal by a preset time. Further, the output driving circuit may also include a counting unit configured to output a counting signal corresponding to a period defined by the output enable reset signal and an output signal of the delay circuit, in response to the internal clock. The output driving circuit may also include an output enable signal output unit configured to output an output enable signal in response to the counting signal and CAS latency information.

In an embodiment, an output control circuit may include a period setting signal generation unit configured to output a setup signal when a delayed locked loop (DLL) locking signal is enabled in response to an inverted signal of the DLL locking signal and an output enable reset signal. The output control circuit may also include a clock division unit configured to divide an internal clock in response to the setup signal to allow a cycle of a divided clock to be longer than a cycle of the internal clock. In addition, the output control circuit may include a shift unit configured to delay the setup signal in response to the divided clock to output a first delayed setup signal. Further, the output control circuit may include an output unit configured to generate a second delayed setup signal by delaying the first delayed setup signal and generate an output enable reset signal from a combination of the second delayed setup signal and the first delayed setup signal.

DETAILED DESCRIPTION

An output control circuit and an output driving circuit including the same according to the invention will be described below with reference to the accompanying figures through various embodiments. The output control circuit may perform a domain crossing operation of synchronizing a read command synchronized with an external clock signal with an internal clock signal. In addition, an output enable signal generated through the output control circuit may contain CAS (Column Address Strobe) latency (CL) information. A semiconductor memory apparatus operates as if it outputted data in synchronization with the external clock signal at a desired time after a read command, using a DLL circuit and the output control circuit. Thus, the output control circuit is required to generate a control signal at an accurate timing to output data according to a designed data output time.

Figure 1:
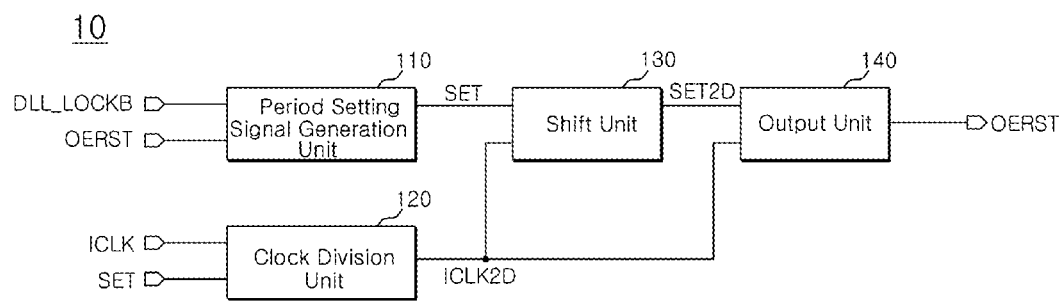
FIG. 1 is a configuration diagram of an output control circuit according to an embodiment.

Referring to FIG. 1, the output control circuit 10 may include a period setting signal generation unit 110, a clock division unit 120, a shift unit 130, and an output unit 140.

The period setting signal generation unit 110 may be configured to output a setup signal SET enabled during a designated period in a state in which a DLL locking signal DLL_LOCK is enabled. More specifically, an inverted signal DLL_LOCKB of the DLL locking signal is disabled, in response to the inverted signal DLL_LOCKB of the DLL locking signal DLL_LOCK and an output enable reset signal OERST.

The clock division unit 120 may be configured to divide an internal clock ICLK at a preset division ratio in response to the internal clock ICLK and the setup signal SET, and output the divided clock ICLK2D. In an embodiment, the clock division unit 120 may be configured to divide the internal clock ICLK such that the cycle of the divided clock ICLK2D is longer than the internal clock ICLK. For example, the division ratio may be set to 1/2.

The shift unit 130 may be configured to delay the setup signal SET by a preset first time in response to the divided clock ICLK2D, and output a first delayed setup signal SET2D. Since the division operation of the clock division unit 120 is performed only during the enable period of the setup signal SET, the first delayed setup signal SET2D outputted from the shift unit 130 may be disabled when the setup signal SET is disabled.

The output unit 140 may be configured to generate a second delayed setup signal SET2.5DB by delaying the first delayed setup signal SET2D by a second time in response to the divided clock ICLK2D. The output unit 140 may also be configured to generate the output enable reset signal OERST by combining the second delayed setup signal SET2.5DB and the first delayed setup signal SET2D.

The first delayed setup signal SET2D, generated by delaying the setup signal SET by the first time through the shift unit 130, may be outputted in synchronization with the divided clock ICLK2D. In an embodiment, the internal clock ICLK is divided so that the divided clock ICLK2D has a longer period than the internal clock ICLK. For example, the division ratio may be accordingly set to 1/2.

When the internal clock ICLK has a short period tCK and is used as a synchronization signal of the shift unit 130, the operating margin of the shift unit 130 may then be reduced to make it difficult to generate the output enable reset signal OERST.

In an embodiment, however, since the first delayed setup signal SET2D is outputted according to the divided clock ICLK2D obtained by dividing the internal clock ICLK to have a long cycle, the operating margin of the shift unit 130 may be secured as a result.

Figure 2:
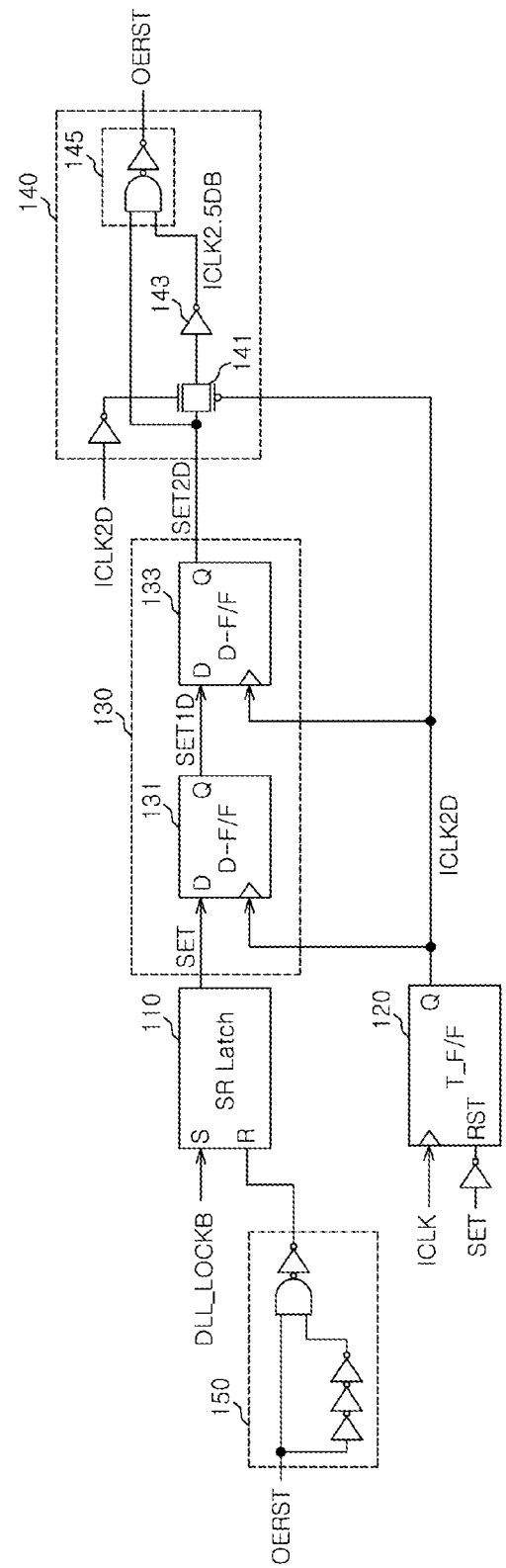
FIG. 2 is a diagram illustrating the output control circuit of FIG. 1.

Referring to FIG. 2, the period setting signal generation unit 110 of the output control circuit 10 may be configured to output the setup signal SET enabled during a designated period in a state where the inverted signal DLL_LOCKB of the DLL locking signal is disabled in response to the inverted signal DLL_LOCKB of the DLL locking signal and the output enable reset signal OERST. The period setting signal generation unit 110 may be implemented with an SR latch circuit, but is not limited thereto.

The period setting signal generation unit 110 may be configured to be reset in response to the output enable reset signal OERST. Thus, the enable period of the setup signal SET may range from the time at which the inverted signal DLL_LOCKB of the DLL locking signal is disabled to when the output enable reset signal OERST is enabled.

Furthermore, the output enable reset signal OERST may be provided to the period setting signal generation unit 110 through a pulse generation circuit 150. The output enable reset signal 110 may then be provided as a reset signal for the period setting signal generation unit 110. However, the output enable reset signal OERST is not limited thereto.

The clock division unit 120 may be configured to divide the internal clock ICLK at a preset division ratio in response to the internal clock ICLK and the setup signal SET, and output the divided clock ICLK2D. For example, the clock division unit 120 may be implemented with a T flip-flop circuit or the like, but is not limited thereto.

The shift unit 130 may be configured to include a first shifter 131 and a second shifter 133. The first shifter 131 may be configured to primarily shift the setup signal SET in response to the divided clock ICKL2D and output a first shifted signal SET1D. The second shifter 133 may be configured to secondarily shift the first shifted signal SET1D in response to the divided clock ICLK2D, and output a second shifted signal as the first delayed setup signal SET2D.

Each of the first and second shifters 131 and 133 may be implemented with a D flip-flop or the like, but are not limited thereto. The shift unit 130 may be configured to generate the first delayed setup signal SET2D by delaying the setup signal SET by a desired time using a single shift circuit. Furthermore, the first and second shifters 131 and 133 may be designed to have substantially the same delay time.

The divided clock ICLK2D may be generated only during the enable period of the setup signal SET. Accordingly, the first delayed setup signal SET2D may be disabled when the setup signal SET is disabled.

The output unit 140 may be configured to include a transmitter 141, a delay 143, and a combiner 145. The transmitter 141 may be configured to determine whether or not to transmit the first delayed setup signal SET2D, in response to the divided clock ICLK2D. The delay 143 may be configured to delay the first delayed setup signal SET2D transmitted through the transmitter 141 by a preset second time, and generate the second delayed setup signal SET2.5DB. The combiner 145 may be configured to combine the first delayed setup signal SET2D and the second delayed setup signal SET2.5DB to generate the output enable reset signal OERST.

More specifically, the output control circuit 10 according to an embodiment may generate the output enable reset signal OERST in synchronization with the divided clock ICLK2D generated while the setup signal SET is enabled. In particular, the divided clock ICLK2D has a longer cycle than the internal clock ICKL. Accordingly, since the setup signal SET is shifted in response to the divided clock ICLK2D having a relatively long cycle, the operating margin of the circuits to shift the setup signal SET may be secured to generate the output enable reset signal OERST having a desired cycle.

Figure 3:
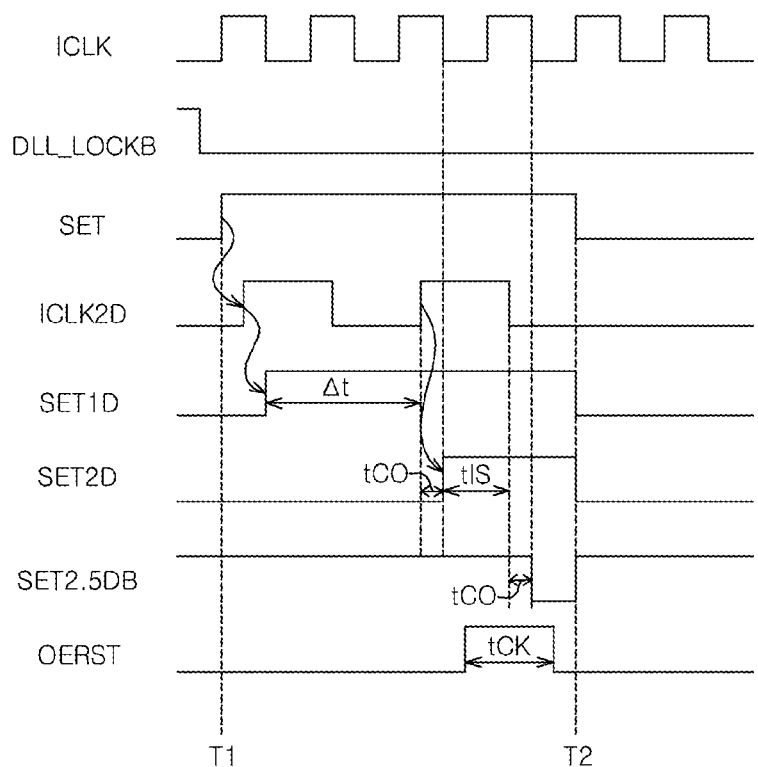
FIG. 3 is a timing diagram for explaining the operation of the output control circuit according to an embodiment.

Referring to FIG. 3, the operation of the output control circuit will be described.

The internal clock ICLK may be supplied into the semiconductor apparatus at a preset cycle tCK.

When a locking operation is performed by the DLL circuit, the inverted signal DLL_LOCKB of the DLL locking signal may be disabled as a result. Since the output enable signal OERST is disabled at a time T1, the setup signal SET outputted from the period setting signal generation unit 110 may then be enabled. FIG. 3 also illustrates a time T2.

The clock division unit 120 may be configured to divide the internal clock ICLK at a preset division ratio in response to the setup signal SET, and output the divided clock ICLK2D. When the division ratio is 1/2, the cycle of the divided clock ICLK2D may become 2tCK.

Accordingly, the first shifter 131 of the shift unit 130, receiving the setup signal SET, may be configured to output the first shifted signal SET1D synchronized with a first rising edge of the divided clock ICLK2D. The second shifter 132 may then receive the first shifted signal SET1D, and output the second shifted signal (first delayed setup signal) SET2D synchronized with a second rising edge of the divided clock ICLK2D.

That is, since a second divided clock ICLK2D pulses in a sufficient setup time Δt after the data SET1D is provided to an input terminal of the second shifter 133, the second shifter 133 may be configured to output the first delayed setup signal SET2D having a precise phase and cycle.

The first delayed setup signal SET2D transmitted from the transmitter 141 in response to the delayed clock ICLK2D may be delayed by the second time. In addition, the first delayed setup signal SET2D may be outputted as the second delayed setup signal SET2.5DB. More specifically, the second delayed setup signal SET2.5DB may be enabled to a low level in synchronization with a falling edge of the second divided clock ICLK2D.

Accordingly, the output enable reset signal OERST, generated through a combination of the first delayed setup signal SET2D outputted in synchronization with a second rising edge of the divided clock ICLK2D and the second delayed setup signal SET2.5DB outputted in synchronization with a second falling edge of the divided clock ICLK2D, may have a cycle that corresponds to tCK.

The sum (tCO+tIS) of the period tCO required until the first delayed setup signal SET2D is enabled after the delayed clock ICLK2D is enabled and the time tIS required until the divided clock ICLK2D is disabled after the first delayed setup signal SET2D is enabled may be less than the cycle tCK of the internal clock ICLK. In such an instance, the output enable reset signal OERST may be generated to have a cycle of tCK.

In an embodiment, the first delayed setup signal SET2D and the second delayed setup signal SET2.5DB may be outputted in synchronization with the divided clock ICLK2D. In the alternative, the divided clock ICLK2D may have a cycle two times longer than the internal clock ICLK, and then be combined to generate the output enable reset signal OERST. Therefore, it is possible to secure the precision in cycle and output timing of the output enable reset signal OERST.

Figure 4:
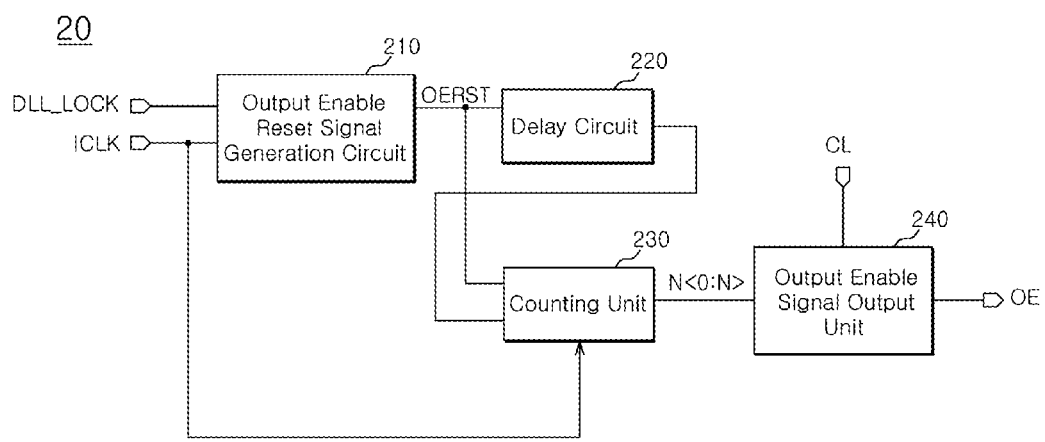
FIG. 4 is a configuration diagram of an output driving circuit according to an embodiment.

Referring to FIG. 4, a configuration diagram of an output driving circuit according to an embodiment is illustrated.

The output driving circuit 20 may be configured to include an output enable reset signal generation circuit 210, a delay circuit 220, a counting unit 230, and an output enable signal output unit 240.

The output enable reset signal generation circuit 210 may be configured to generate the output enable reset signal OERST in response to the DLL locking signal DLL_LOCK and the internal clock ICLK. The output enable reset signal generation circuit 210 may be configured as illustrated in FIG. 1 or 2. More specifically, the output enable reset signal generation circuit 210 may be configured to shift the setup signal SET in synchronization with the divided clock ICLK2D obtained by dividing the internal clock ICKL to have a longer cycle. The output enable reset signal generation circuit 210 may also combine the first delayed setup signal SET2D and the second delayed setup signal SET2.5DB which are generated through the setup signal SET. Further, the output enable reset signal generation circuit 210 may generate the output enable reset signal OERST having a precise cycle.

The delay circuit 220 may be configured to delay the output enable reset signal OERST by a preset time. The delay circuit 220 may be configured to delay the output enable reset signal OERST by a time obtained by modeling a delay line for delaying an external clock signal by a preset time in the DLL circuit. The delay circuit 220 may then delay the output enable reset signal OERST by a time obtained by modeling a delay amount in the semiconductor memory apparatus, required until the signal outputted from the DLL circuit is outputted to the outside of the semiconductor memory apparatus.

The counting unit 230 may be configured to output a count signal N<0:N> corresponding to a period defined by the output enable reset signal OERST and the delayed output enable reset signal OERST outputted from the delay circuit 220, in response to the internal clock ICLK. Therefore, the count signal N<0:N> may indicate a signal delay amount by the delay circuit 220.

The output enable signal output unit 240 may be configured to output an output enable signal OE in response to the count signal N<0:N> and CL information.

According to the generated output enable signal OE, data may be outputted at a desired time after a read command. In particular, since the output enable signal reset signal OERST required to generate the output enable signal OE is generated at a precise timing, the output enable signal OE may also be enabled at a precise timing.

Figure 5:
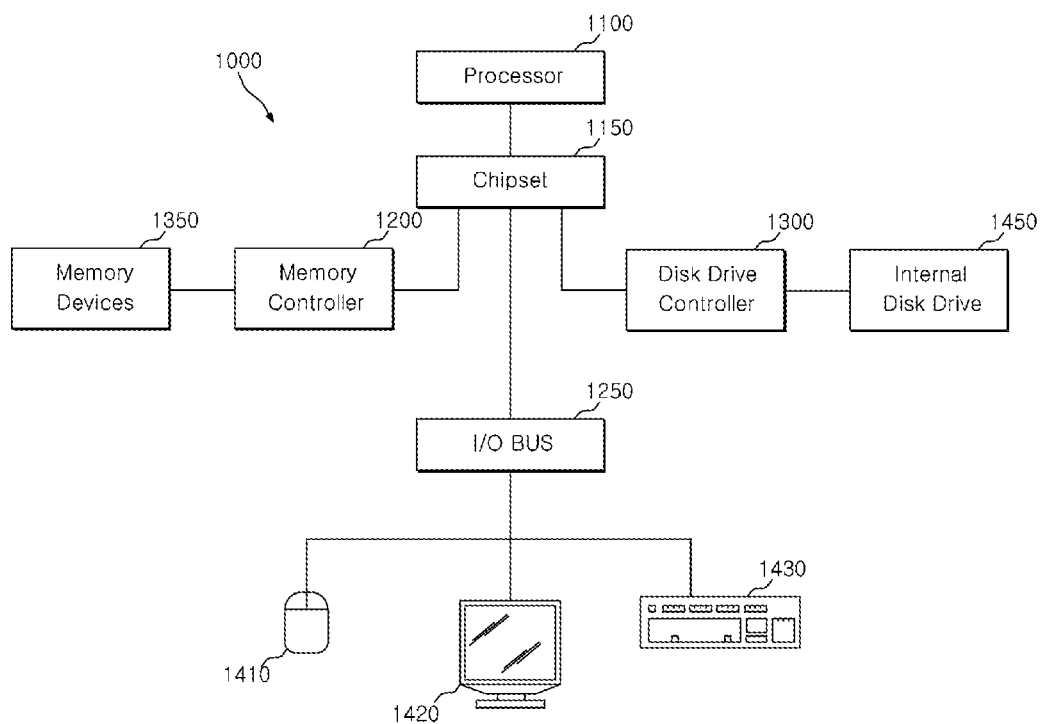
FIG. 5 illustrates a block diagram of a system employing a memory controller circuit in accordance with an embodiment of the invention.

Referring to FIG. 5, a system 1000 may include one or more processors 1100. The processor 1100 may be used individually or in combination with other processors. A chipset 1150 may be electrically coupled to the processor 1100. The chipset 1150 is a communication pathway for signals between the processor 1100 and other components of the system 1000. Other components may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory device 1350 may include the output control circuit 10 described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset 1150 using virtually any type of communication protocol.

While certain embodiments have been described above, it will be understood to those skilled in the art that the embodiments described are by way of example only. Accordingly, the semiconductor apparatus described should not be limited based on the described embodiments. Rather, the semiconductor apparatus described should only be limited in light of the claims that follow when taken in conjunction with the above description and accompanying figures.

What is claimed is:

1. An output driving circuit comprising:
    an output enable reset signal generation circuit configured to generate a first delayed setup signal by shifting a setup signal in synchronization with a divided clock obtained by dividing an internal clock in response to a delayed locked loop (DLL) locking signal, and generate an output enable reset signal by processing the first delayed setup signal in response to the divided clock;

a delay circuit configured to delay the output enable reset signal by a preset time;

a counting unit configured to output a counting signal corresponding to a period defined by the output enable reset signal and an output signal of the delay circuit, in response to the internal clock; and an output enable signal output unit configured to output an output enable signal in response to the counting signal and CAS latency information.

2. The output driving circuit according to claim 1, wherein the output enable signal reset signal generation circuit comprises:

a period setting signal generation unit configured to output the setup signal enabled during a designated period, in response to the DLL locking signal and the output enable reset signal;

a clock division unit configured to divide the internal clock at a preset division ratio in response to the internal clock and the setup signal, and output a divided clock;

a shift unit configured to shift the setup signal by a preset first time in response to the divided clock, and output a first delayed setup signal; and an output unit configured to receive and process the first delayed setup signal in response to the divided clock, and output the output enable reset signal.

3. The output driving circuit according to claim 2, wherein the clock division unit divides the internal clock to allow the divided clock to have a longer cycle than the internal clock.

4. The output driving circuit according to claim 2, wherein the shift unit comprises:

a first shifter configured to primarily shift the setup signal in response to the divided clock and output a first shifted signal; and a second shifter configured to secondarily shift the first shifted signal in response to the divided clock, and output a second shift signal as the first delayed setup signal.

5. The output driving circuit according to claim 2, wherein the output unit generates a second delayed setup signal by delaying the first delayed setup signal by a preset second time in response to the divided clock, and generates the output enable reset signal by combining the first delayed setup signal and the second delayed setup signal.

6. The output driving circuit according to claim 5, wherein the output unit comprises:

a transmitter configured to transmit the first delay setup signal in response to the delayed clock;

a delay configured to generate the second delayed setup signal by delaying the first delayed setup signal transmitted through the transmitter; and a combiner configured to generate the output enable reset signal by combining the first and second delayed setup signals.

7. The output driving circuit according to claim 2, wherein the shift unit outputs the first delayed setup signal in synchronization with a rising edge of the divided clock during an enable period of the setup signal, and the output unit outputs the second delayed setup signal in synchronization with a falling edge of the divided clock.

8. An output control circuit comprising:

a period setting signal generation unit configured to output a setup signal when a delayed locked loop (DLL) locking signal is enabled in response to an inverted signal of the DLL locking signal and an output enable reset signal;

a clock division unit configured to divide an internal clock in response to the setup signal to allow a cycle of a divided clock to be longer than a cycle of the internal clock;

a shift unit configured to delay the setup signal in response to the divided clock to output a first delayed setup signal; and an output unit configured to generate a second delayed setup signal by delaying the first delayed setup signal and generate an output enable reset signal from a combination of the second delayed setup signal and the first delayed setup signal.

9. The output control circuit according to claim 8, wherein the first delayed setup signal is outputted in synchronization with the divided clock.

10. The output control circuit according to claim 8, wherein the output enable reset signal is generated in synchronization with the divided clock.

* * * * *